United States Patent [19]

Buchmann et al.

[11] Patent Number: 5,032,219
[45] Date of Patent: Jul. 16, 1991

[54] METHOD FOR IMPROVING THE PLANARITY OF ETCHED MIRROR FACETS

[75] Inventors: Peter L. Buchmann; Peter Vettiger, both of Langnau am Albis; Otto Voegeli; David J. Webb, both of Ruschlikon, all of Switzerland

[73] Assignee: International Business Machines Corporation, Armonk, N.Y.

[21] Appl. No.: 533,748

[22] Filed: Jun. 6, 1990

[30] Foreign Application Priority Data

Jun. 16, 1989 [EP] European Pat. Off. ........ 89810463.3

[51] Int. Cl.⁵ ...................... H01L 21/306; B44C 1/22
[52] U.S. Cl. .................................. 156/643; 156/649; 156/651; 156/659.1; 156/662; 350/96.12
[58] Field of Search ............... 156/643, 647, 649, 651, 156/653, 655, 657, 659.1, 662; 427/38, 39; 350/96.1, 96.11, 96.12; 357/16, 17, 30; 372/43, 44, 48, 50; 437/2, 3, 126, 129

[56] References Cited

FOREIGN PATENT DOCUMENTS 0095826 12/1983 European Pat. Off. .

OTHER PUBLICATIONS

IEEE Journal of Quantum Electronics, vol. QE-23, No. 8, Aug. 1987, pp. 1283-1286; J. Chen. S. Lee, "AlGaAs/GaAs Visible Ridge Waveguide Laser with Multicavity Structure".

IEEE Journal of Quantum Electronics, vol. QE-23, No. 3, Mar. 1987, pp. 309-312; L. D. Zhu et al., "Low Threshold Ridge Waveguide Single Quantum Well Laser Processed by Chemically Assisted Ion Beam Etching".

Primary Examiner—William A. Powell
Attorney, Agent, or Firm—Donald M. Boles

[57] ABSTRACT

A method, and device produced therewith, for improving the planarity of etched mirror facets 18 of integrated optic structures with non-planar stripe waveguides, such as ridge or groove diode lasers or passive devices such as modulators and switches. The curvature of the mirror facet surface at the edges of the waveguide due to topographical, lithographical and etch process effects, causes detrimental phase distortions, and is avoided by widening the waveguide end near the mirror surface thereby shifting the curved facet regions away from the light mode region to surface regions where curvature is not critical.

7 Claims, 3 Drawing Sheets

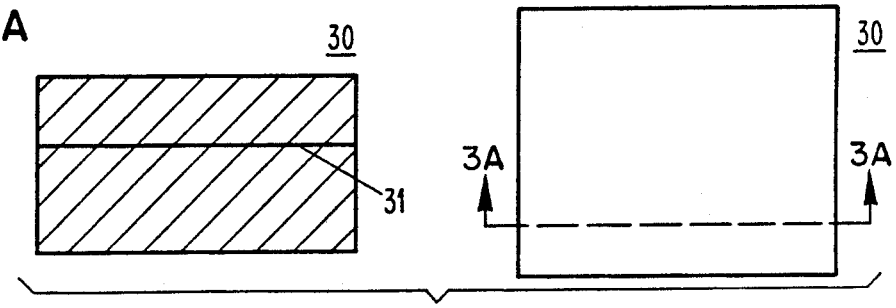
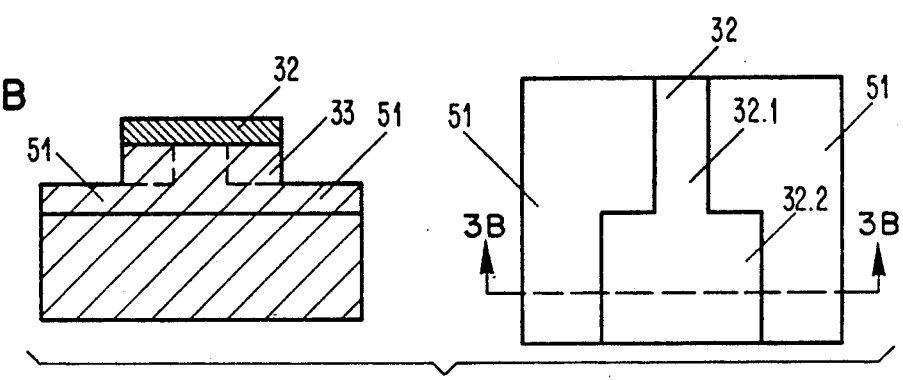
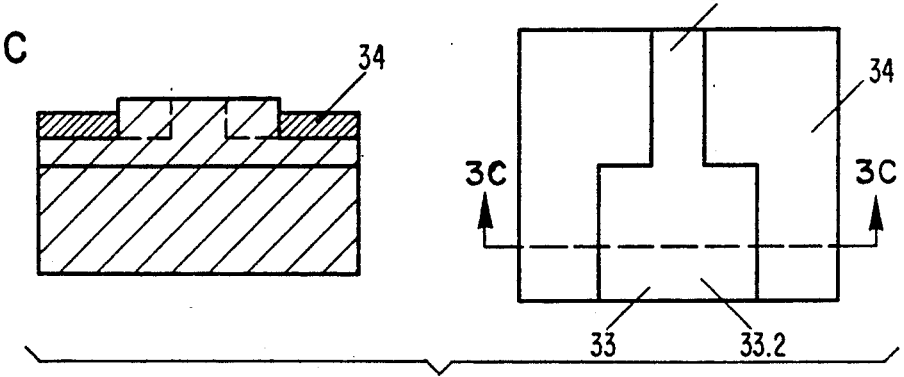
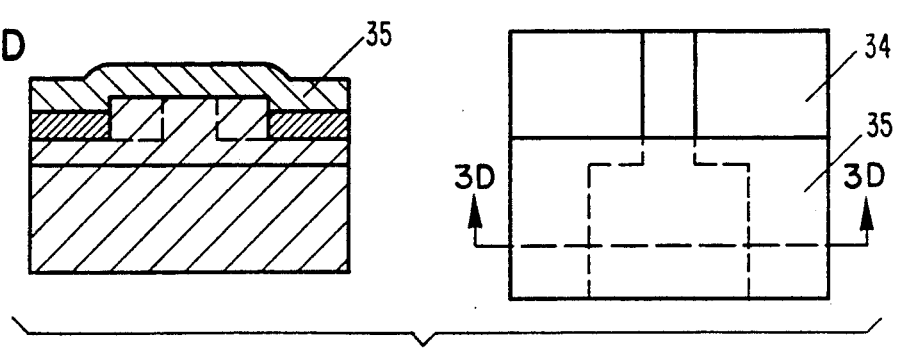

SIDE VIEW          TOP VIEW

METHOD FOR IMPROVING THE PLANARITY OF ETCHED MIRROR FACETS

DESCRIPTION

1. Field of Invention

The invention relates to a method for improving the planarity of etched mirror facets of integrated optic structures with non-planar stripe waveguides. Devices with active waveguides such as ridge diode lasers or groove diode lasers, passive waveguides, as well as integrated optic modulators and switches, are examples of structures that can be produced with the disclosed invention.

2. Background of the Invention

Integrated optic devices with non-planar stripe waveguide structure have found wide applications in a variety of information handling systems because of their compact size and because their technology is compatible with that of the associated electronic circuitry.

One of the most noteworthy stripe waveguide structures presently used is the semiconductor diode laser which can advantageously be used for applications in data communication, optical memory and laser printing systems. In order to further improve performance, efforts are made to increase the scale of integration of opto-electronic integrated circuits. This requires replacing at least one cleaved mirror facet of the diode laser by an etched mirror. Good quality etched mirrors not only permit integrating monitor diodes with electronic circuits, but also facilitate such processes like mirror coating and testing at the wafer level. They also result in the added benefit of reduced handling, increased yield and decreased fabrication and testing costs. Etched mirrors make it possible to realize very short cavity lasers, groove-coupled cavity lasers, beam deflectors and surface emitters. In addition, new types of lower and waveguide structures with curved and angled mirror facets can also be fabricated using etching techniques.

A laser structure which has been determined to be a good choice for high performance applications is the so-called ridge GRINSCH (Graded-Index Separate Confinement Heterostructure) laser diode which is well known to the art. The article entitled "High-Power Ridge-Waveguide AlGaAs GRINSCH Laser Diode" by Ch. Harder, et al. (Electr. Lett., Vol. 22, No. 22, Sept. 25, 1986, pp. 1081–1082 discusses such a structure in great detail. It provides high quality beams at extremely low power dissipation, is very efficient and has potential for high reliability, which is of utmost importance for high-speed optical interconnections. The ridge waveguide, which can be fabricated using simple and established processes, effectively stabilizes the transverse mode. GRINSCH laser diode structures with very low threshold currents and current densities have been reported.

Major requirements for etching laser mirrors include: high etch rates (4–6 μm etch depth); low etch rate selectivity of various materials of the laser structure; vertical smooth facets with low damage; and surface roughness less than $\lambda/10$. Chemically assisted ion beam etching (CAIBE) is known as the best method so far for the fabrication of vertical etched mirror facets of III–V compound (e.g. AlGaAs/GaAs) laser structures with layers of varying Al concentrations. Such processes have been described in various publications, which are specifically incorporated by reference herein, namely, "Chemically Assisted Ion Beam Etching Process for High Quality Laser Mirrors" by P. Buchmann, et al. (Int Conf. on Microlithography, Vienna, September 1988), and "High Power Etched-Facet Laser" by P. Tihanyi et al. (electr. Lett., Vol. 23, No. 15, July 16, 1987, pp. 772–773), which are incorporated by reference herein.

An additional requirement, planarity, also referred to as flatness of the mirror facets, is particularly important for single-mode lasers used in optical storage and i single-mode fiber communications. Any curvature of the mirror surface in the light mode region causes a phase-shift distortion in the reflected and the transmitted light. Reflected light with a strong phase front distortion has a low coupling factor to the back-travelling waveguide mode. Thus, the effective reflectivity of a curved mirror of a single-mode waveguide is reduced and the threshold current increases. Such phase distortions also shows up in the far-field o a laser output beam (side-lobes, multi-lobes). A non-Gaussian beam shape of the far-field indicates that the beam cannot be focused to the ideal diffraction-limited spot using simple optics, resulting in a reduction of the possible storage density on, for example, a magneto-optic disk.

Planarity of the mirror facet is difficult to achieve when the laser structure has a pronounced topography as is the case for ridge waveguide and channeled substrate lasers, particularly where non-planar waveguide structures are used. Two effects are primary causes of the curvature of a mirror.

1. Topography/Lithography: Applying an etch mask layer causes some planarization, i.e., for a ridge laser, the mask is thinner on top of the ridge than on the etched horizontal surfaces on both sides of it. During mask fabrication, this causes an inward recess of the mask edge where the ridge is positioned. This recess is transferred to the mirror facet by an anisotropic etching process. Although this recess ranges from a few tens of nm to 500 nm, it is detrimental to the laser light wavefront ($\lambda/2$ in a GaAs laser corresponds to only 110 nm). In experiments, large wafer-to-wafer variations in the curvature of the mirror facets were observed, with the highest distortion occurring below the edges of the ridge.

2. Mirror etching process: The process used for the formation of the mirror facets (such as CAIBE) can also introduce a curvature of the surface depending on the anisotropy and the undercutting of the etching process. If chemically reactive gases are introduced to the etching system, the local concentration of active species will vary as a function of topography, resulting in an additional curvature of the etched facets.

This curvature problem has been recognized before and has been reported by N. Bouadma et al., in on article "GaAs/AlGaAs Ridge Waveguide Laser Monolithically Integrated with a Photodiode Using Ion Beam Etching" (Electr Lett., Vol. 23, No. 16, July 1987, pp. 855–857) which is specifically incorporated by reference herein. The authors describe an attempt to solve the problem by shortening the ridge in the mirror facet region by a few microns. With this approach, topographic effects can be avoided but at the expense of wavefront and far field distortions which occur because the waveguide provided by the ridge is drastically affected.

Accordingly, it is a main object of the present invention to provide a method for improving the planarity (or flatness) of etched mirror facets of integrated optic structures with non-planar stripe waveguides.

It is another object of the invention to provide a method for etching semiconductor diode laser mirrors of the same or at least of similar quality than that of mirrors obtained by using conventional high-quality cleaving techniques.

Still another object is to provide a method for etching diode laser mirrors with extremely flat, smooth and vertical surfaces using simple, easy-to-control process steps.

A further object is to provide a diode laser structure having at least one etched mirror which is of the same or at least of similar quality than that of mirrors obtained by using conventional high-quality cleaving techniques.

SUMMARY OF THE INVENTION

This invention solves the problems hitherto encountered due to curvature of the mirror facets by using a waveguide that is widened at its end sections near the etched mirror facets. This change permits shifting the curved facet regions away from the light mode region to the surface region where curvature is not as critical.

The main advantage offered by the invention is that the problems caused by topographic and lithographic effects on the etched mirror surface are avoided, an important achievement for ridge waveguide and channeled substrate lasers. The resulting mirror facets, planar in the light mode region, significantly improve the reflectivity and absorption coefficient of the etched mirrors as well as the far-field characteristics of single-mode etched mirror lasers. The coupling loss due to the non-guiding widened ridge section is, on the other hand, negligible.

DESCRIPTION OF THE DRAWINGS

The invention is described in detail below with reference to drawings which illustrate a specific embodiment of the invention, in which:

FIGS. 3A–3G are illustrations of the various steps of the inventive mirror etching method applied to fabricate a SQW GRINSCH laser with widened ridge end sections.

DETAILED DESCRIPTION OF THE INVENTION

Prior to describing the invention in greater detail, the general concept will be outlined by comparing the conventional method with the inventive method, using a ridge AlGaAs/GaAs SQW GRINSCH structure with etched mirrors. This example will be used in the preferred embodiment throughout the invention.

Figure 1:
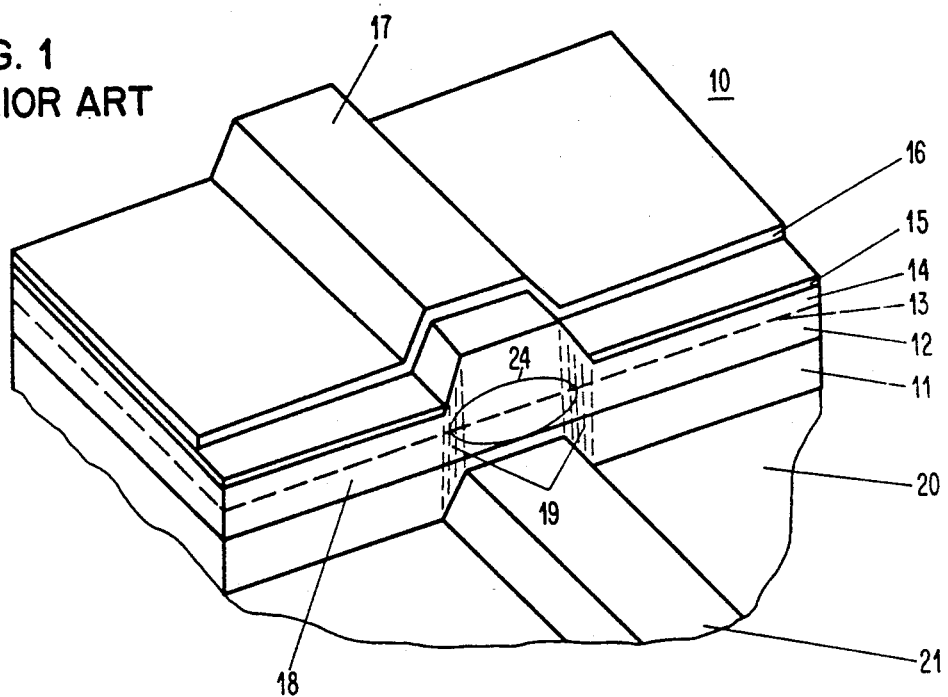
FIG. 1 is a perspective view of a conventional ridge single quantum well (SQW) GRINSCH laser with a straight ridge resulting in curvature in the light mode region.

FIG. 1 schematically illustrates the main elements of a conventional ridge GRINSCH laser structure 10. The drawing shows the structure after completion of the mirror facet etching process. Deposited on a GaAs substrate 11 are: a lower AlGaAs cladding layer 12, an active GaAs layer 13 forming the quantum well, and an upper AlGaAs cladding layer 14. The latter has been etched to form ridge 17. The etched surfaces on both sides of the ridge are covered with an insulation layer 15. A metallization film 16, deposited on top of the layered laser structure provides the electrical contact. The vertical wall 18 of an etched mirror groove provides the mirror facet. The bottom of the groove 20 displays the same profile as the top surface of the initial laser structure, the "transferred" ridge being designated 21.

The light mode region, shown as an ellipse 24, centers around the active layer 13 and is laterally defined by the stripe ridge 17. The shaded areas 19 illustrate the bent regions of substantial curvature in the facet surface. These bent or curved regions cause the detrimental distortion laser beam wavefront, which the present invention overcomes.

Figure 2:
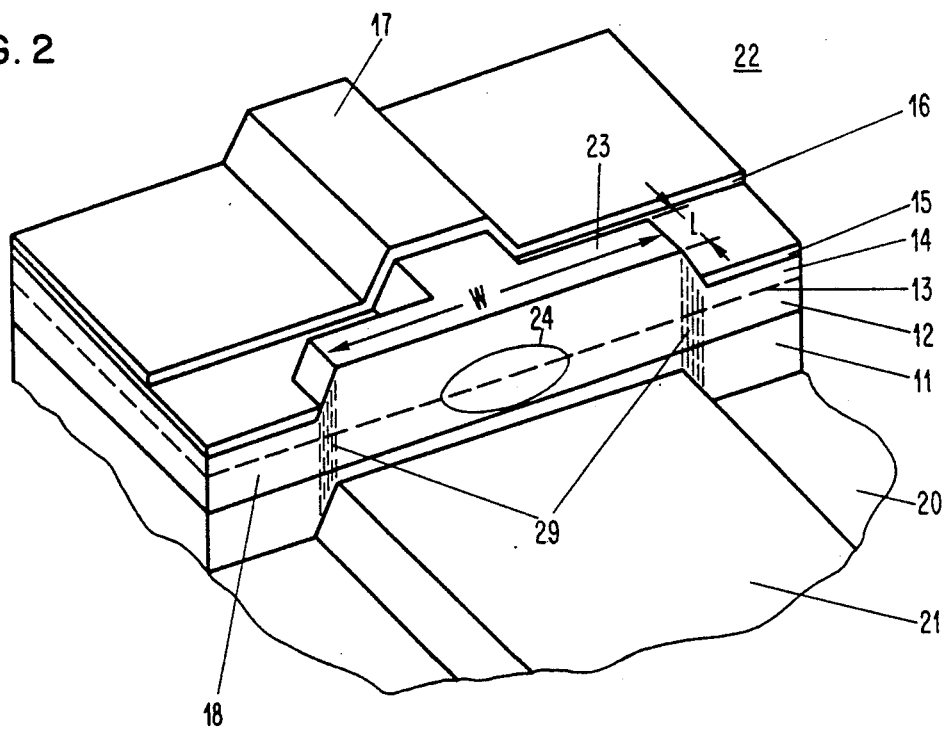
FIG. 2 is a perspective view of a ridge single quantum well (SQW) GRINSCH laser with a widened-end ridge in accordance with the present invention, eliminating the curvature in the light mode region.

FIG. 2 is a schematic illustration of a ridge SQW GRINSCH structure 22 fabricated in accordance with the principles of the invention. The ridge 17 is widened at its end near the mirror facet, forming a broad or flared section 23. Its width w is wider than the lateral extension of the light mode region 24. Thus, the bent facet regions, formed under the ridge edges 19 (in FIG. 1), are shifted away from the light mode region 24 to the region 29 where facet curvature is not critical. Thus, the mirror surface is completely in the light mode region since it is not affected by the curvature in areas 29

In order to effectively eliminate any curvature in the critical light mode region 24, the widened waveguide section 23 needs to be substantially wider than the lateral extension of the full-width-at-half-maximum (FWHM) of the intensity distribution of the emitted laser beam. The length of the laterally non-guiding widened ridge section 23 has to be as short as possible in order to minimize coupling loss between the divergent beam and the back-travelling waveguide mode. A length of 1 to 2 $\mu$m is sufficient to avoid any topography effects within the light mode region 24 and yet, is short enough to keep the mode coupling loss sufficiently low so as to be negligible.

Referring now to FIGS. 3A–3G, the successive steps of the inventive method, applied to produce a ridge SQW GRINSCH laser, are illustrated in detail. Each figure includes two drawings, a cross-sectional view left, (denoted "−1" and a top view, denoted "−2") of the processed structure, respectively. In the preferred embodiment, the laser structure consists of a stack of AlGaAs/GaAs layers grown on the (100) surface of an n-type GaAs wafer using a molecular beam epitaxy (MBE) process. The mirror facets are provided by the vertical walls of a groove etched into the stack.

As illustrated in FIG. 3A, the process is initiated from a layered AlGaAs/GaAs laser structure 30. It is degreased, cleaned, and made ready for the process steps required for the fabrication of the ridge and mirror facets. For simplicity sake, only the active layer 31 of all the layers in the stack is individually shown.

Initially, a positive resist is applied, exposed to the laser ridge pattern and developed (preferably using contact lithography and a Cr mask). The patterned photoresist 32, with a (usually long) narrow section 32.1 and a widened section 32.2, serve as a mask in the wet etch step (in a preferred solution of $H_2SO_4/H_2O_2/H_2O$) required to form the ridge 33 and having the same shape as the photoresist. The etched surface is designated as 51 (FIG. 3B).

Figure 3E:
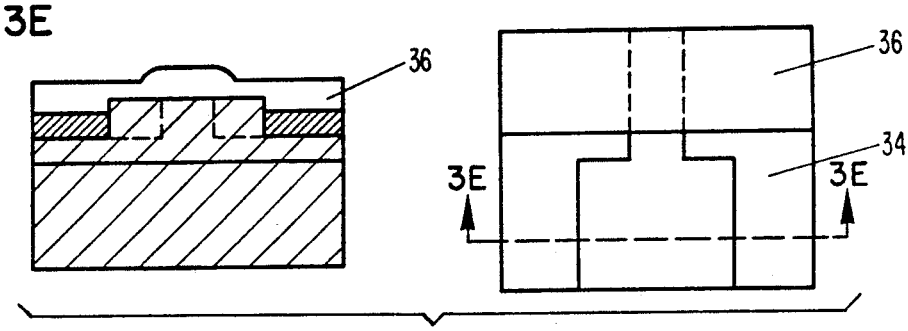

Typical dimensions for a single-mode waveguide are: ridge height of 1.5 $\mu$m, ridge width of 3 $\mu$m, and ridge (or laser cavity) length of 200 to 1000 $\mu$m. The widened waveguide end section must be at least 8 μm wide and about 2 μm long after mirror etching. Subsequently, a Si₃N₄ insulation layer 34, 200 nm thick is deposited, using plasma enhanced chemical vapor deposition PECVD), thereby embedding both the ridge 33 and the photoresist mask 32. The resist is then lifted off (by Acetone) leaving a self-aligned non-isolated contact stripe on top of the ridge 33, and leaving etched areas 51 covered by insulation layer 34 (FIG. 3C). Next, a polyimide layer is deposited and structured, using a reactive ion etch (RIE) process with O₂, to serve as a lift-off mask 35 for the definition of the top (p—) contact pad of the laser. The mask ends about 2 μm from the widened ridge end section 33.2, as show in FIG. 3D. A TiPtAu film is then deposited, followed by lift-off resulting in the top contact 35 extending over the length of the ridge but ending about 2 μm in front of the widened ridge end section, thereby leaving a window for the etching of the mirror groove (FIG. 3E).

Figure 3F:
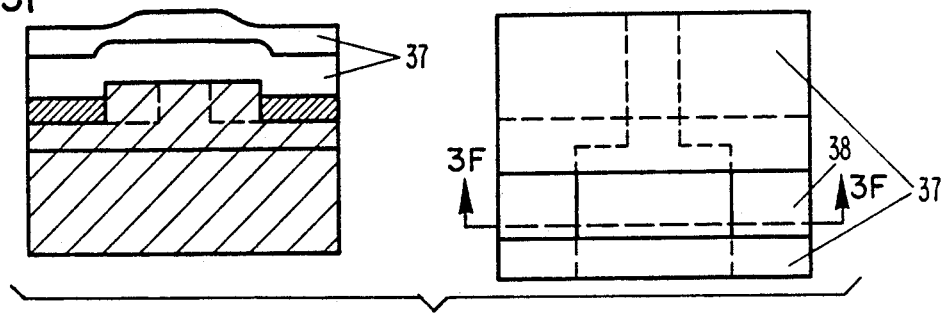
Figure 3G:
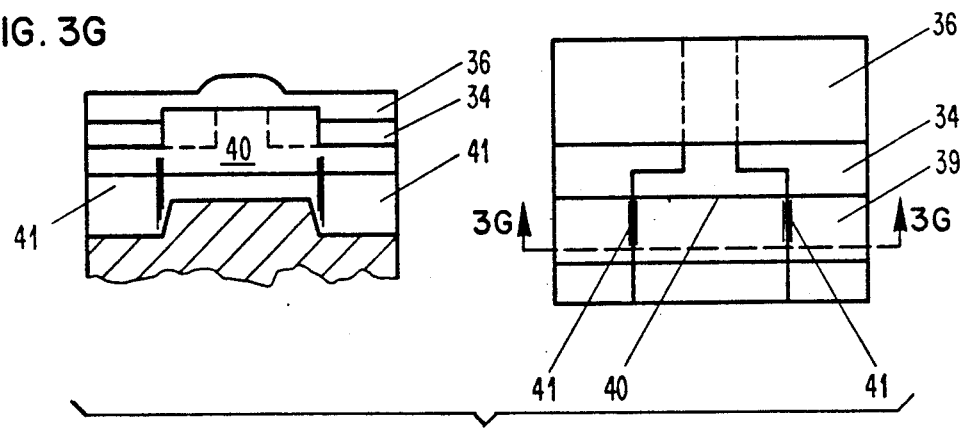

In a next and subsequent steps, a mask 37 is formed for etching the mirror groove. Whereas a single layer mask may be used, a multi-layer structure is preferred, because it provides smoother vertical mirror facets. Such multi-layer etch mask and its use in the fabrication of opto-electronic semiconductor structures is described in European Patent Application 88.810.613.5 (filed on Sept. 12, 1988) and incorporated by reference herein. It consists of two photoresist layers, hard-baked bottom layer and soft-baked top layer, with a thin amorphous dielectric intermediate layer sandwiched in between. The etch pattern, lithographically formed in the top resist layer, is successively transferred, first to the intermediate layer and then to the bottom hard-baked resist layer, the latter serving as the mask 37 during the subsequent mirror groove etch process. It is patterned to expose the underlying semiconductor structure area 38 (FIG. 3F).

For mirror groove etching, a Cl₂/Ar—CAIBE process is preferably used with an Argon energy of 500 eV and a Cl₂ flow of 15 sec/cm through a feed ring, the sample rotating at room temperature for 15 minutes. After etching, the hard-baked resist 37 is removed by washing in a plasma. This is followed by cleaning in solvents (FIG. 3G) The resulting mirror groove 39, providing mirror facet 40, has a depth of 4 to 6 μm and the facets have a roughness less than 20 nm. Facet curvature is only found under the edges 41 of the widened ridge end sections, leaving the light mode region confined to the absolutely flat region of the mirror.

FIG. 3 illustrates the fabrication of one of the mirror facets of a laser diode, although the facet at the other end of the waveguide could also be made at the same time. Low and high reflectivity coatings are deposited on these front and rear facets by angled ion beam sputtering. The simplest process consists of applying an Al₂O₃ passivation layer to each facet. Via holes are then etched through the coating to gain access to the bonding pads using a simple resist mask and a CF₄—RIE step.

To simplify chip cleavage, the substrate is either lapped or wet etched on the backside (bottom surface of the structure) to a thickness of 150 μm. After Ar sputter cleaning, a GEAuNiAu metallization is evaporated and alloyed at 390° C. for 60 seconds to form the bottom (n—) contact.

The invention herein described applies to the fabrication of a ridge diode laser, more specifically, a ridge SQW GRINSCH laser. It should, however, be understood that the invention is also applicable to other integrated optic structures with non-planar stripe waveguides such as groove diode lasers (with negative topography) or passive waveguides and devices such as modulators and switches.

It is also noted that the sequence of the process steps may be modified. In the above described embodiment, the stripe waveguide, having a widened end section, was formed before mirror facet etching. This sequence may be changed by first etching the groove forming mirror facets to obtain the initial layer structure, and then forming the stripe waveguide with a widened end section.

It is evident to those skilled in the art that other materials may be advantageously used and various other modifications made. In general, the process parameters, etchants or plasma used, the indicated dimensions and other device characteristics chosen for the description of the preferred embodiment, may be changed without departing from the spirit of the invention.

What is claimed is:

1. A method for improving the planarity of the etched mirror facet of an integrated optic structure with a non-planar stripe waveguide, comprising the steps of:
   providing an integrated optic structure with a non-planar stripe waveguide with at least one widened end section;
   anisotropically etching the mirror facet, such that said mirror facet intersects at an angle thereof said widened end section; and whereby only a short section of said widened end section remains so as to minimize the length of said widened end section.

2. A method for improving the planarity of the etched mirror facet of an integrated optic structure with a non-planar stripe waveguide, comprising the steps of:
   growing on a wafer at least one layer from which said integrated optic structure with non-planar stripe waveguide is to be made;
   anisotropically etching a mirror groove to form a mirror facet;
   providing said non-planar stripe waveguide with at least one short widened end section contiguous to said mirror facet, such that said end section is substantially wider than the lateral extension of the full-width-at-half-maximum of the light mode section intensity distribution; and
   etching said non-planar stripe waveguide.

3. A method for improving the planarity of the etched mirror facet as in claim 1, wherein said structure is a ridge diode laser with a light mode region, comprising the steps of:
   providing a semiconductor substrate active layer with an adjoining upper and lower cladding layers, to form a waveguide ridge structure and a groove, the sidewalls of said groove serving as etched mirror facets;
   etching the adjoining upper layer to said active layer to form a ridge with a long narrow center waveguide section;
   providing at least one end of said ridge with a widened end section substantially wider than the lateral extension of the full-width-at-half-maximum (FWHM) of the light mode intensity distribution;
   applying an anisotropic dry etch process to etch through said widened end section of said ridge into a plurality of layers to form said groove, said groove deep enough to pass through the active layer and the cladding layers;

placing said groove such that only a short part of said widened section of said ridge remains to minimize the length of the non-guiding widened section; and whereby the resulting facet curvature caused by at least one of topographic, lithographic and etching effects occurs at the edge of the widened end section of said groove and away from the light mode region.

4. A method for improving the planarity of the etched mirror facet as in claim 1 or 3, wherein said widened end section is substantially wider than the lateral extension of the full-width-at-half-maximum (FWHM) of the light mode intensity distribution.

5. A method for improving the planarity of the etched mirror facet as in claim 1, 2 or 3, wherein said widened end section has a length between 1 and 5 μm.

6. A method for improving the planarity of the etched mirror facet as in claim 1, 2 or 3, wherein, for said anisotropic etching, a chemically assisted ion beam etch (CAIBE) process is used.

* * * * *